United States Patent
Higuchi et al.

(10) Patent No.: US 11,852,985 B2
(45) Date of Patent: Dec. 26, 2023

(54) IMPRINT METHOD, IMPRINT APPARATUS, AND FILM FORMATION APPARATUS

(71) Applicant: Kioxia Corporation, Tokyo (JP)

(72) Inventors: Takeshi Higuchi, Yokohama Kanagawa (JP); Anupam Mitra, Yokohama Kanagawa (JP); Takahiro Iwasaki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/466,259

(22) Filed: Sep. 3, 2021

(65) Prior Publication Data

US 2022/0082954 A1 Mar. 17, 2022

(30) Foreign Application Priority Data

Sep. 17, 2020 (JP) ................. 2020-156112

(51) Int. Cl.
*G03F 9/00* (2006.01)
*G03F 7/00* (2006.01)
(Continued)

(52) U.S. Cl.
CPC .......... *G03F 9/7042* (2013.01); *G03F 7/0042* (2013.01); *G03F 7/0382* (2013.01);
(Continued)

(58) Field of Classification Search
CPC .... G03F 9/7042; G03F 7/0042; G03F 7/0382; G03F 7/094; G03F 7/161; G03F 7/162;
(Continued)

(56) References Cited

U.S. PATENT DOCUMENTS 4,662,985 A * 5/1987 Yoshida ................. G03F 7/094
216/48
5,240,817 A * 8/1993 Stout ....................... G03F 7/161
430/315

(Continued)

FOREIGN PATENT DOCUMENTS

JP 2013-202982 10/2013
JP 2016-058663 4/2016

(Continued)

OTHER PUBLICATIONS

Teyssandier, F. and Love, B.J. (2011), MMA bulk polymerization and its influence on in situ resin viscosity comparing several chemorheological models. J. Appl. Polym. Sci., 120: 1367-1371 (Year: 2010).*

(Continued)

*Primary Examiner* — Mark F. Huff
*Assistant Examiner* — Alexander Nicholas Lee
(74) *Attorney, Agent, or Firm* — Foley & Lardner LLP

(57) ABSTRACT

An imprint method includes supplying a first photocurable resist to a first region of an object; irradiating the first resist with first light; forming a second resist over the object; bringing a template into contact with the second resist; and irradiating at least the second resist with second light through the template while the template is in contact with the second resist.

12 Claims, 10 Drawing Sheets

(51) Int. Cl.
*G03F 7/16* (2006.01)
*G03F 7/09* (2006.01)
*G03F 7/004* (2006.01)
*G03F 7/20* (2006.01)
*G03F 7/038* (2006.01)

(52) U.S. Cl.
CPC .............. *G03F 7/094* (2013.01); *G03F 7/161* (2013.01); *G03F 7/162* (2013.01); *G03F 7/2018* (2013.01); *G03F 7/70208* (2013.01)

(58) Field of Classification Search
CPC .. G03F 7/2018; G03F 7/70208; G03F 7/0047; G03F 7/027; G03F 7/0002
See application file for complete search history.

(56) References Cited

U.S. PATENT DOCUMENTS

| | | | | |
|---|---|---|---|---|
| 5,753,417 | A * | 5/1998 | Ulrich | G03F 7/70466 430/394 |
| 9,941,137 | B2 * | 4/2018 | Takahata | H01L 21/3086 |
| 10,754,244 | B2 | 8/2020 | Ito et al. | |
| 2005/0170269 | A1 * | 8/2005 | Nakagawa | H01L 21/76801 430/30 |
| 2006/0094204 | A1 * | 5/2006 | Isono | G03F 7/094 257/E21.257 |
| 2009/0166317 | A1 * | 7/2009 | Okushima | G03F 7/0002 216/11 |
| 2011/0195189 | A1 * | 8/2011 | Kawamura | B82Y 40/00 427/259 |
| 2013/0140269 | A1 * | 6/2013 | Chiang | G03F 7/0043 977/887 |
| 2015/0014819 | A1 | 1/2015 | Hattori et al. | |
| 2015/0044417 | A1 | 2/2015 | Koike | |
| 2016/0075124 | A1 | 3/2016 | Tokue et al. | |
| 2017/0136683 | A1 * | 5/2017 | Nishimura | G03F 7/0002 |
| 2019/0080922 | A1 * | 3/2019 | Khusnatdinov | H01L 21/02345 |
| 2020/0006124 | A1 | 1/2020 | Mitra et al. | |

FOREIGN PATENT DOCUMENTS

| | | |
|---|---|---|
| JP | 2017-201698 | 11/2017 |
| JP | 7155002 B2 | 10/2022 |

OTHER PUBLICATIONS

Song, J.-O., McCormick, A.V. and Francis, L.F. (2013), Depthwise Viscosity Gradients in UV-Cured Epoxy Coatings. Macromol. Mater. Eng., 298: 145-152 (Year: 2013).*

* cited by examiner

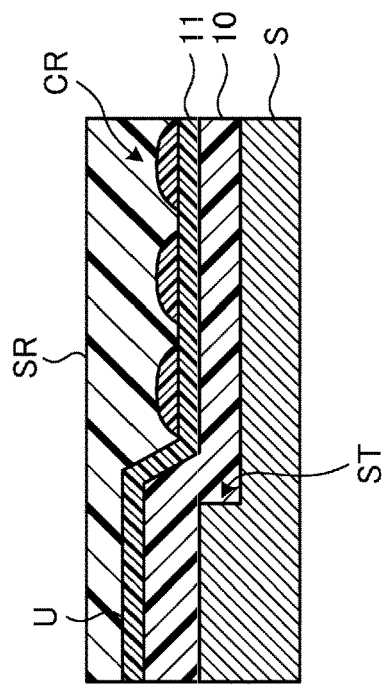
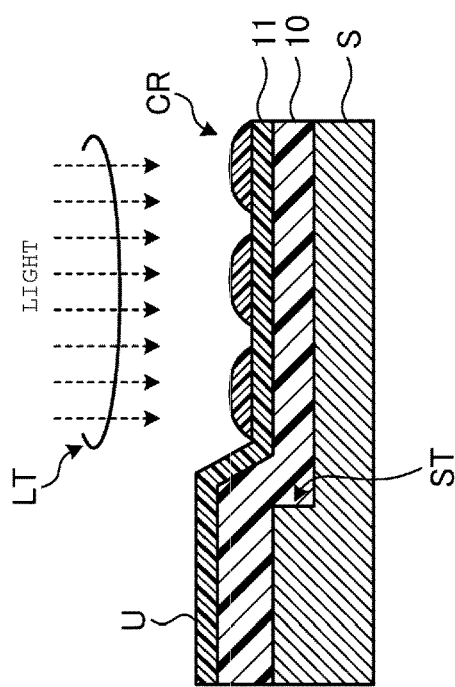

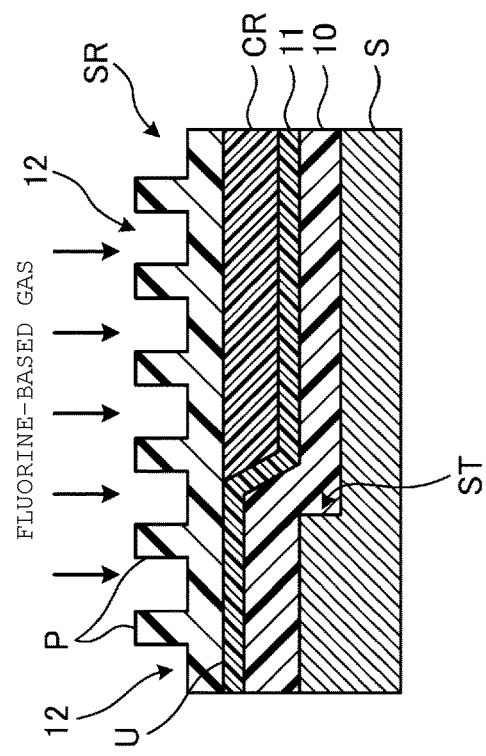
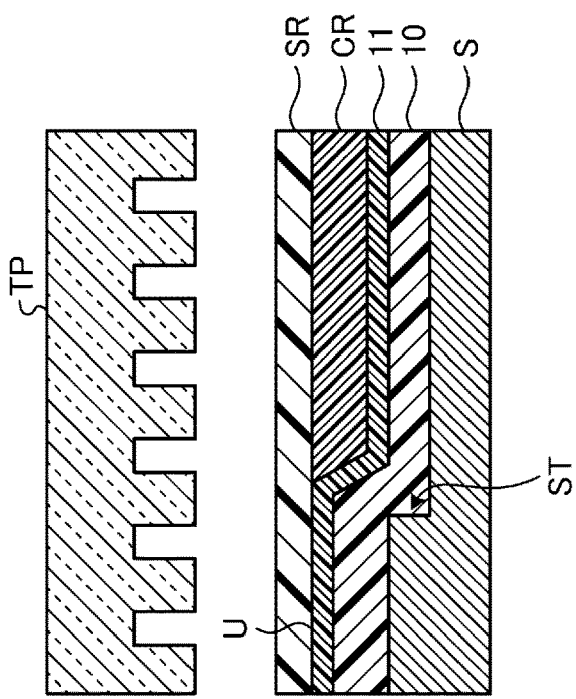

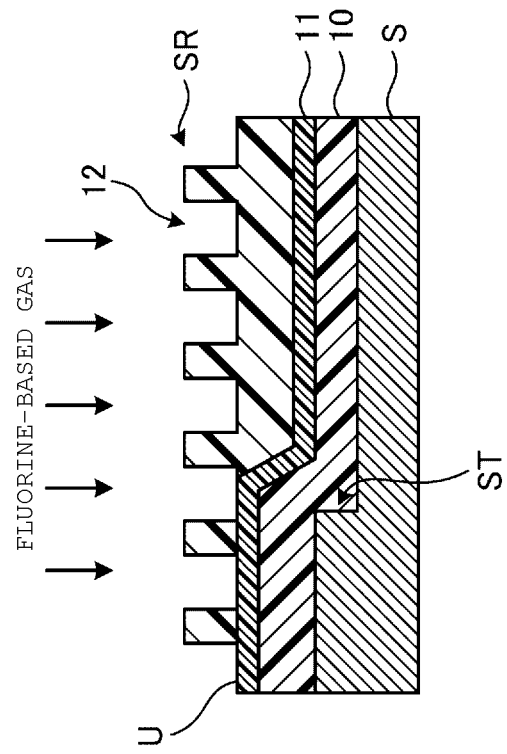
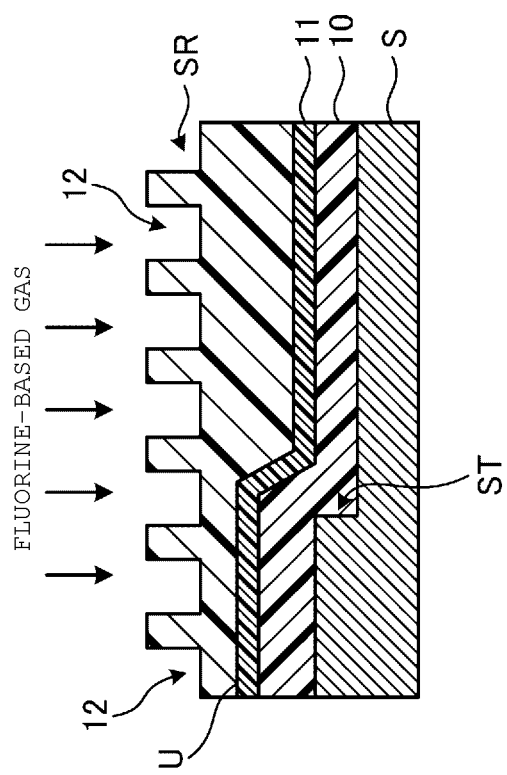

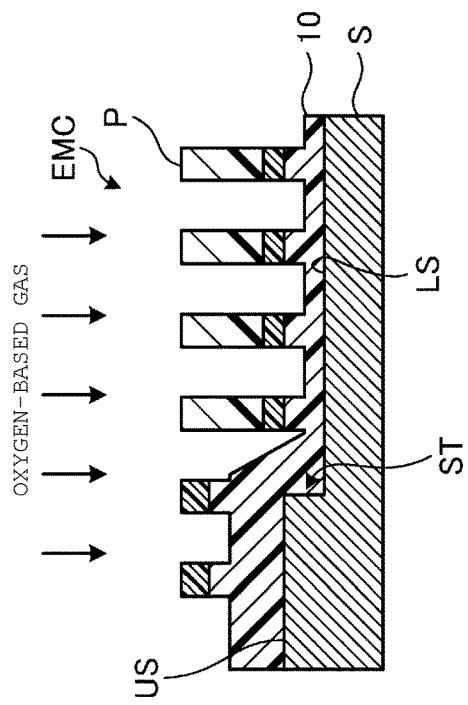
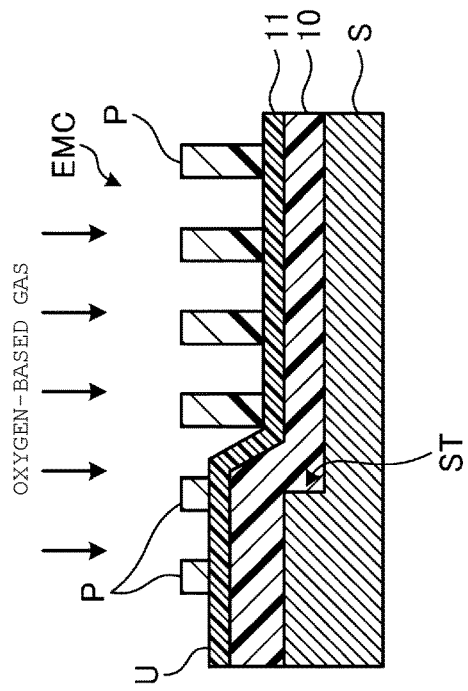

IMPRINT METHOD, IMPRINT APPARATUS, AND FILM FORMATION APPARATUS

CROSS-REFERENCE TO RELATED APPLICATION

This application is based upon and claims the benefit of priority from Japanese Patent Application No. 2020-156112, filed Sep. 17, 2020, the entire contents of which are incorporated herein by reference.

FIELD

Embodiments described herein relate generally to an imprint method, an imprint apparatus, and a film formation apparatus.

BACKGROUND

Imprint lithography is known as a method for forming an etching mask. In the imprint lithography, a template having an uneven portion corresponding to a circuit pattern is pushed against a resist layer formed on an etching target. When the template is pressed against the resist layer, a recess portion of the template is filled with a resist to form a projection portion in the resist layer while the resist remains between the projection portion of the template and the etching target. The resist remaining in this way is also called a residual resist film.

DESCRIPTION OF THE DRAWINGS

FIGS. 2A to 2D are partial cross-sectional views showing the imprint method according to the first embodiment.

FIGS. 3A to 3D are partial cross-sectional views showing the imprint method according to the first embodiment, following FIGS. 2A to 2D.

FIGS. 4A to 4D are partial cross-sectional views showing an imprint method according to a comparative example.

FIGS. 5A and 5B are partial cross-sectional views showing the imprint method according to the comparative example, following FIGS. 4A to 4D.

DETAILED DESCRIPTION

Figure 1A:
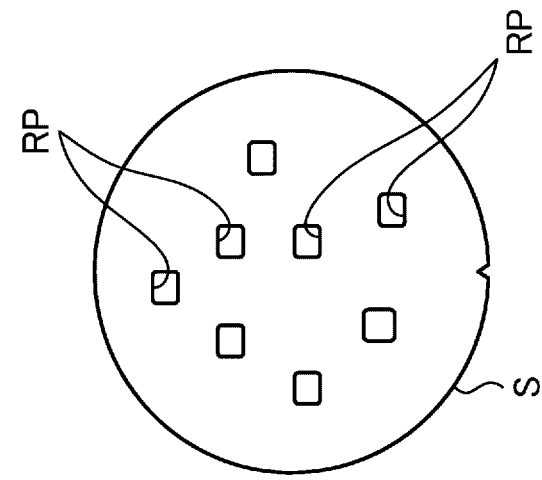
FIGS. 1A to 1C are explanatory diagrams showing an outline of an imprint method according to a first embodiment.

Embodiments provide an imprint method capable of suitably etching a lower layer.

In general, according to one embodiment, an imprint method according to one embodiment may include supplying a first photocurable resist to a first region of an object; irradiating the first resist with first light; forming a second resist over the object; bringing a template into contact with the second resist; and irradiating at least the second resist with second light through the template while the template is in contact with the second resist.

In the following, an embodiment of a non-limiting example of the present disclosure will be described with reference to the accompanying drawings. In all the accompanying drawings, the same or corresponding members or components are designated by the same or corresponding reference numerals, and duplicate description thereof is omitted. In addition, the drawings are not intended to show relative ratios between members or components, or between thicknesses of various layers, and therefore specific thicknesses and dimensions maybe determined by those skilled in the art in the light of the following non-limiting embodiments.

First Embodiment

Figure 1B:
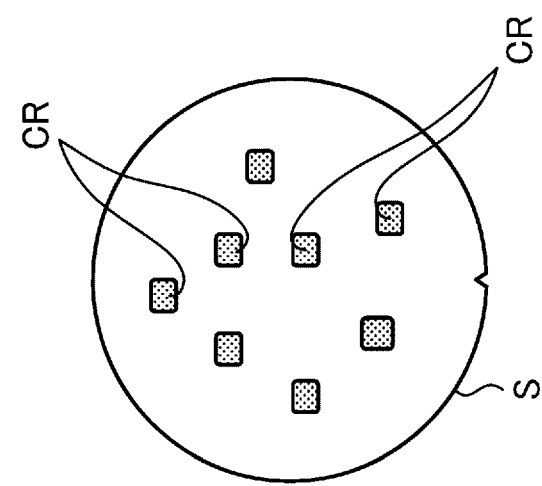
Figure 1C:
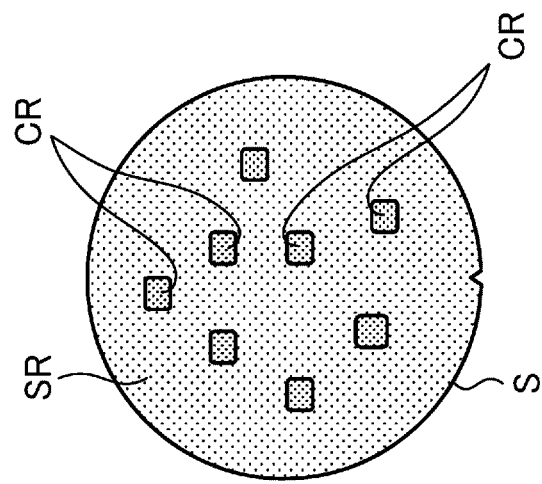

An imprint method according to a first embodiment will be described with reference to FIGS. 1A to 3D. FIGS. 1A to 1C are explanatory diagrams showing an outline of the imprint method, and FIGS. 2A to 3D are cross-sectional views showing an example of a pattern formed by the imprint method.

As shown in FIGS. 1A to 1C, the imprint method includes acquiring step information on a front surface of a substrate S, specifying a recess portion RP based on the step information (FIG. 1A), supplying an organic resist CR to the recess portion RP (FIG. 1B), and applying an inorganic resist SR to the front surface of the substrate S and an upper surface of the organic resist CR (FIG. 1C). Here, the step information may be acquired by measuring the front surface of the substrate S using, for example, a scanning electron microscope (SEM), an atomic force microscope (AFM), a contact or non-contact stylus surface roughness meter, or the like. Moreover, when roughness is formed on the substrate S based on specific design data, the step information may be extracted from the design data. The step information may include, for example, a coordinate location on the substrate S and a height at the location thereof. Then, a portion deeper than a predetermined threshold value may be specified as the recess portion RP.

Further, for example, a plurality of layers may be formed on the front surface of the substrate S, and in this case, the step information may be acquired from the measurement on the front surface of the uppermost layer. Besides, in this case, the recess portion RP may be defined by the uppermost layer. Further, the uppermost layer may be formed of, for example, a material containing carbon such as spin-on carbon (SOC).

Inkjet may be used, for example, to supply the organic resist CR to the recess portion, and a spin coater may be used, for example, to apply the inorganic resist SR thereto.

Next, the imprint method according to the first embodiment will be specifically described with reference to FIGS. 2A to 3D. Further, FIGS. 2A to 3D show a part of a cross section that crosses the front surface of the substrate S and the recess portion RP. Moreover, in the following description, an example will be taken in which the substrate S is an etching target and an SOC film 10 formed on the substrate S is processed into an etching mask. It is noted that the etching target may not be limited to the substrate S, but may be a layer formed above the substrate S or the uppermost layer among a plurality of layers.

Figure 2B:
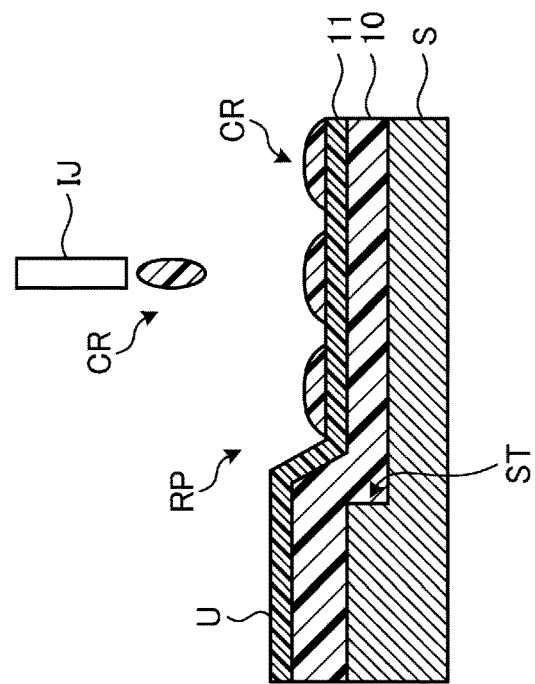
Figure 2A:
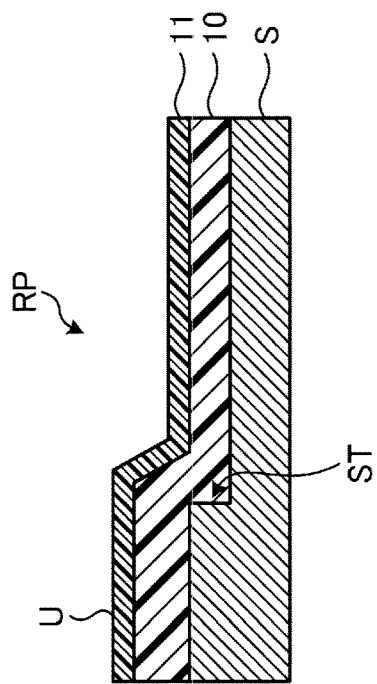

Referring to FIG. 2A, the SOC film 10 is formed on the substrate S, and an adhesive layer 11 is formed thereon. The SOC film 10 is formed with the recess portion RP that reflects a step ST of the substrate S, and the adhesive layer 11 on the SOC film 10 is also conformally formed with respect to the recess portion RP. The adhesive layer 11 may be, for example, a film containing carbon to improve adhesiveness with a resist film described later, and may include a functioning group (e.g., a hydroxyl group (OH group) or a carboxyl group (COOH group), an amino group ($NH_2$ group), etc.) having a strong interaction with the resist.

Further, in the following description, a surface around the recess portion RP may be referred to as an upper surface U.

Next, as shown in FIG. 2B, the organic resist CR is discharged from an inkjet nozzle IJ toward the recess portion RP, and the organic resist CR is supplied to the recess portion RP. A location of the recess portion RP may be specified from the above step information. The organic resist CR referred to here may be a resist material configured with, for example, an organic substance, and including at least an acrylic group or a methacrylic group. In addition, an amount of the organic resist CR supplied to each recess portion RP may be determined to be as close as possible to a volume of the recess portion RP obtained from the step information in a range not exceeding the volume. Further, the organic resist CR discharged from the inkjet nozzle IJ to the recess portion RP adheres to the recess portion RP in a droplet state, and does not tend to fuse with each other. This is because an electrostatic repulsive force acts between the droplets.

Next, as shown in FIG. 2C, light LT is irradiated to the organic resist CR supplied to the recess portion RP. The light LT has a wavelength at which the used organic resist CR is photosensitive. However, an intensity of the light LT may be at an extent where a viscosity of the organic resist CR is increased, and moreover, may be at an extent where the evaporation of a solvent of the organic resist CR is inhibited. For example, the intensity of the light LT may be a light intensity lower than a light intensity when irradiating light through a template described later. Specifically, the light LT is desirably irradiated to the organic resist CR to such an extent that a viscosity of, for example, about 10 (mPa·s) rises to a viscosity in a range of, for example, 100 to 1,000 (mPa·s) by the irradiation of the light LT. That is, the intensity of the light LT may be set to such an extent that the organic resist CR is not completely cured even by the irradiation of the light LT. Such an intensity of the light LT may be determined, for example, by performing a preliminary experiment or the like. Further, the light LT may be locally irradiated to the recess portion RP, or may be irradiated to an entire surface including the upper surface U.

Next, as shown in FIG. 2D, the inorganic resist SR is applied by, for example, a spin coater so as to cover the upper surface U and the recess portion RP to which the organic resist CR is supplied. The inorganic resist SR referred to here may be a resist containing one or two or more types of inorganic elements among silicon (Si), aluminum (Al), boron (B), phosphorus (P), sulfur (S), arsenic (As), and iron (Fe). Here, the organic resist CR adhered to the recess portion RP in a droplet state is fused by the inorganic resist SR (or its solvent). Moreover, while a viscosity of the inorganic resist SR is about 100 to 400 (mPa·s), a viscosity of the organic resist CR is increased by the irradiation of the light LT, and thus the two are slightly mixed at an interface with each other, but rarely mixed as a whole. Therefore, the recess portion RP is occupied by the organic resist CR (see FIG. 3A). Then, as shown in FIG. 3A, a template TP is mainly pushed against the inorganic resist SR. The inorganic resist SR and the organic resist CR are cured by irradiating light through the template TP while the template TP is in contact with the inorganic resist SR. Then, the template TP is peeled off from the inorganic resist SR.

Figure 3D:
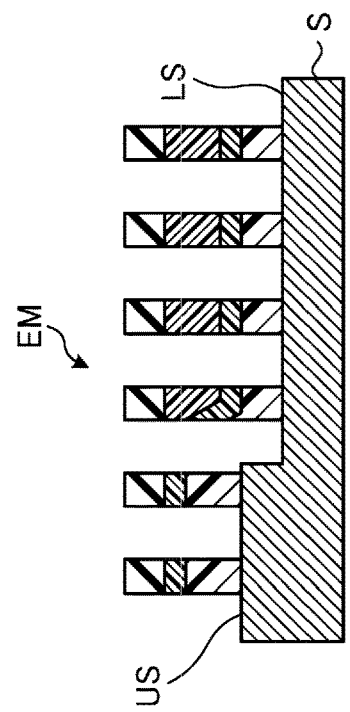
Figure 3C:
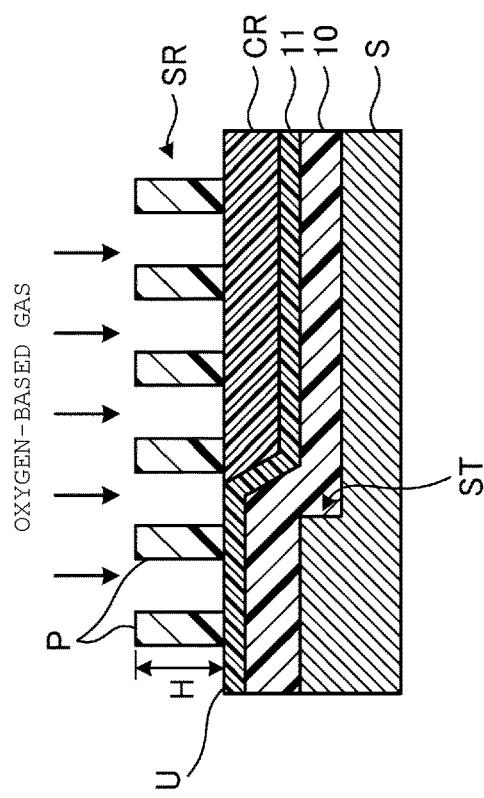

As a result, the inorganic resist SR mainly has an uneven shape that reflects an uneven shape of the template TP, as shown in FIG. 3B. Here, a residual film 12 remains between projection portions P of the inorganic resist SR (at portions corresponding to projection portions of the template TP when the template TP is pressed thereagainst). The residual film 12 is etched and removed by a reactive ion etching (RIE) method using a fluorine-based gas (FIG. 3C). Further, when removing the residual film 12, the projection portions P of the inorganic resist SR are also etched, and its heights are also lowered.

Subsequently, the inorganic resist SR is used as a mask, and the adhesive layer 11, the SOC film 10, and the organic resist CR are etched by the RIE method using an oxygen-based gas. As a result, as shown in FIG. 3D, an etching mask EM for the substrate S is obtained. Then, when the substrate S is etched using the etching mask EM, a circuit pattern of the template TP is transferred to the substrate S.

Further, when etching by the RIE method using an oxygen-based gas, an etching rate (nm/sec) of the organic resist CR is preferably in a range of −10% to +10% of etching rates of the adhesive layer 11 and the SOC film 10. According to this, the organic resist CR, the adhesive layer 11 and the SOC film 10 can be etched at substantially the same rate. However, in order to shorten a time required for etching until a lower surface LS of the substrate S is exposed after exposing an upper surface US thereof (FIG. 3D), the etching rate of the organic resist CR is desirably high within the above range. Further, such an etching rate condition may be satisfied by appropriately selecting a resist material of the organic resist CR and adjusting various conditions in the RIE method.

Next, an effect of the imprint method according to the first embodiment will be described with reference to a comparative example. FIGS. 4A to 5B are explanatory diagrams showing an imprint method according to the comparative example, and correspond to FIGS. 2A to 3D.

Figure 4B:
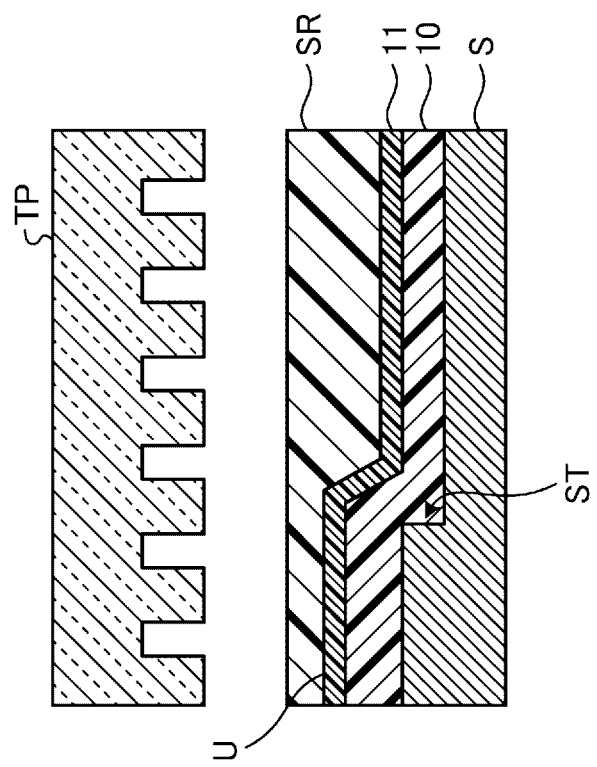
Figure 4A:
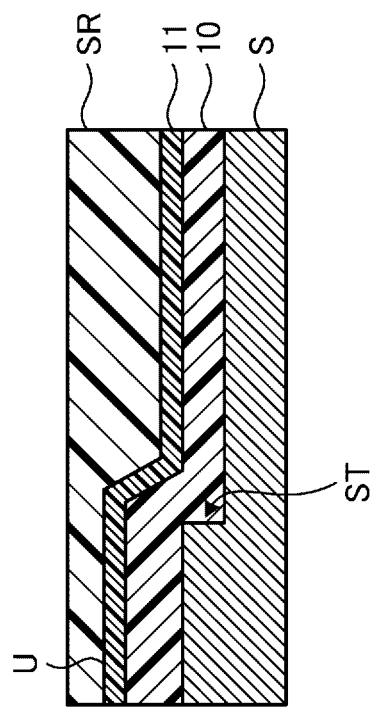

Referring to FIG. 4A, the SOC film 10 is formed on the substrate S, and the adhesive layer 11 is formed thereon. Also in this comparative example, the recess portion RP reflecting the recess portion of the substrate S is formed. Then, the inorganic resist SR is applied so as to cover the upper surface U and the recess portion RP. That is, a process of supplying the organic resist CR from the inkjet nozzle IJ to the recess portion RP and irradiating the light LT in the imprint method according to the first embodiment does not exist in the comparative example. When the inorganic resist SR is applied, the recess portion RP is flatly embedded by the inorganic resist SR. That is, a front surface of the inorganic resist SR forms substantially the same surface on the upper surface U and on the recess portion RP. In other words, the inorganic resist SR is thin on the upper surface U and thick on the recess portion RP.

Next, as shown in FIG. 4B, the template TP is pushed against the inorganic resist SR, and an uneven shape of the template TP is transferred to the inorganic resist SR. Subsequently, the residual film 12 is removed by the RIE method using a fluorine-based gas as shown in FIG. 4C. Here, even when the residual film 12 on the upper surface U is removed as shown in FIG. 4D, the residual film 12 remains in the recess portion RP. Since the inorganic resist SR is hardly etched by the RIE method using an oxygen-based gas when etching the adhesive layer 11 and the SOC film 10, the residual film 12 of the inorganic resist SR remaining in the recess portion RP should be removed. Therefore, the removal of the residual film 12 is continued until the residual film 12 of the recess portion RP is removed. Then, the residual film 12 of the recess portion RP is removed to obtain an etching mask EMC (FIG. 5A).

Since the projection portions P of the inorganic resist SR are also etched by the RIE method using a fluorine-based gas during the removal of the residual film 12, heights thereof are lowered as a whole. Therefore, as shown in FIG. 5A, the projection portions P may have sufficient heights in the recess portion RP to subsequently etch the adhesive layer 11 and the SOC film 10, but may not have sufficient heights in the upper surface U. That is, when the adhesive layer 11 and the SOC film 10 are etched by the RIE method using an oxygen-based gas, the inorganic resist SR should remain until the end of the etching, but may disappear above the upper surface US of the step of the substrate S as shown in FIG. 5B. Then, a desired circuit pattern (uneven pattern) is not transferred.

As described above, in the comparative example, the inorganic resist SR is thin on the upper surface U and thick on the recess portion RP (FIG. 4A). Therefore, after the template TP is pushed, a thick residual film 12 remains in the recess portion RP (FIGS. 4C and 4D), and an etching time for removing the residual film is increased. Then, after the removal of the residual film 12, a thickness of the inorganic resist SR on the upper surface U becomes relatively thinner with respect to that of the recess portion RP (FIG. 5A). Therefore, there is a high possibility that the inorganic resist SR disappears on the upper surface U while the adhesive layer 11 and the SOC film 10 are etched by using the inorganic resist SR.

In contrast, in the imprint method according to the first embodiment, the recess portion RP is substantially occupied by the organic resist CR, and the inorganic resist SR is provided thereon. Therefore, thicknesses of the inorganic resist SR are not significantly different between on the upper surface U and above the recess portion RP. Besides, since the organic resist CR can be etched at an etching rate comparable to those of the adhesive layer 11 and the SOC film 10 by the RIE method using an oxygen-based gas, it is not necessary to remove the organic resist CR in advance. That is, a time required for etching to remove the residual film 12 is sufficient enough until the residual film 12 on the upper surface U is removed, and completed earlier than that in the case of the comparative example.

The above becomes clearer when comparing FIG. 3C and FIG. 5A. At the time when the etching of the adhesive layer 11 and the SOC film 10 is started, in the comparative example, as shown in FIG. 5A, the projection portions P on the upper surface U of the inorganic resist SR become lower than the projection portions P in the recess portion RP. On the other hand, in the imprint method according to the first embodiment, the inorganic resist SR has substantially the same thickness H on the upper surface U and above the recess portion RP. Therefore, even during the etching of the adhesive layer 11 and the SOC film 10, the inorganic resist SR becomes uniformly thin, but there is little change in relative thickness on the upper surface U and above the recess portion RP. Besides, as described above, since the organic resist CR is also etched almost simultaneously with the adhesive layer 11 and the SOC film 10, a pattern of the inorganic resist SR can be transferred to the under layer as it is. From the above, the advantages of the imprint method according to the first embodiment are understood.

Second Embodiment

Figure 6:
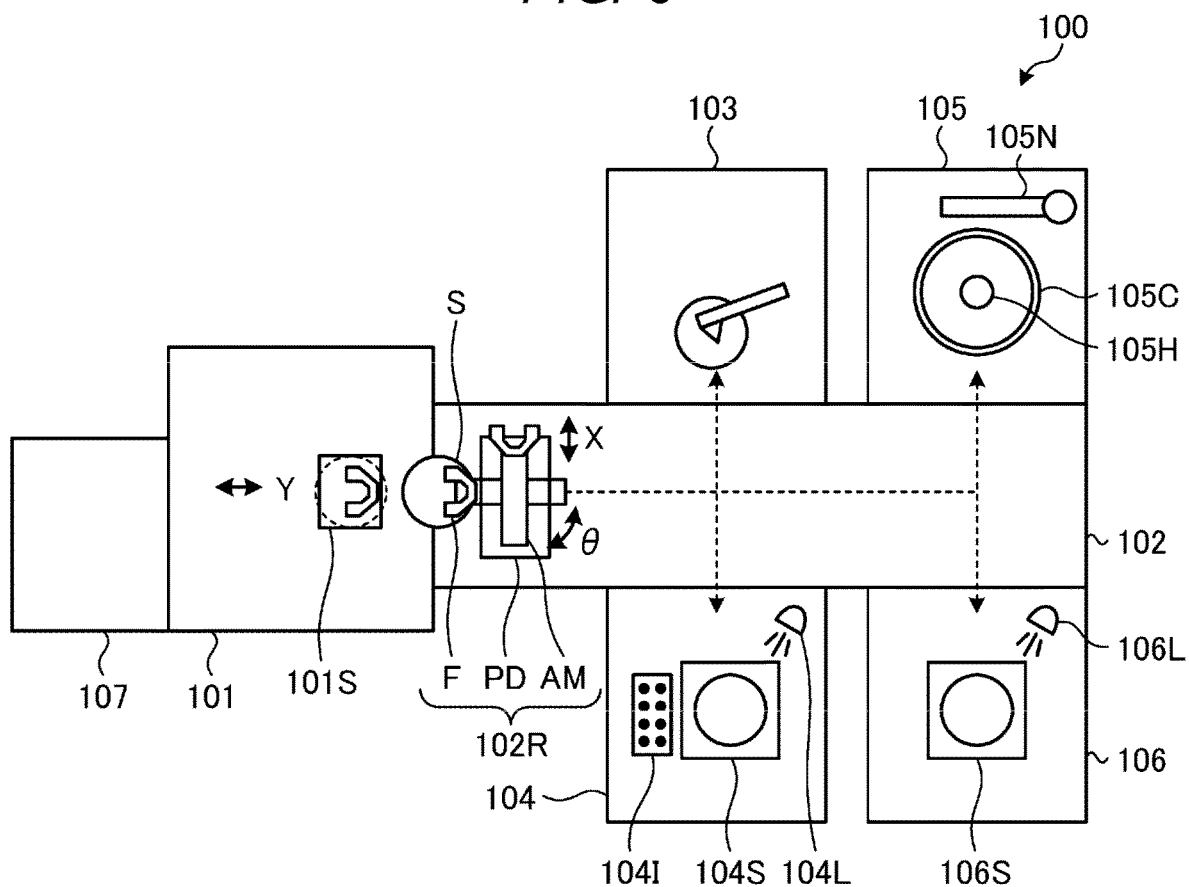
FIG. 6 is a top view schematically showing an imprint apparatus according to a second embodiment.

Next, an imprint apparatus according to a second embodiment will be described with reference to FIG. 6. As shown in FIG. 6, an imprint apparatus 100 according to the present embodiment includes a substrate loading/unloading unit 101, a conveyance path 102, a substrate step measurement unit 103, a first liquid application unit 104, a second liquid application unit 105, and an imprint unit 106, and a control unit 107.

The substrate loading/unloading unit 101 has a substrate stage 101S. The substrate stage 101S is movable, for example, in a Y direction in the drawing, and cooperates with a conveyance robot 102R, which is movably provided in the conveyance path 102, to allow delivery of the substrate S between the substrate loading/unloading unit 101 and the conveyance path 102.

The conveyance path 102 connects the substrate loading/unloading unit 101, the substrate step measurement unit 103, the first liquid application unit 104, the second liquid application unit 105, and the imprint unit 106 to one another to allow conveyance of the substrate S among these units 101, 103 to 106. In addition, the conveyance robot 102R provided in the conveyance path 102 has a pedestal PD and a conveyance arm AM. The pedestal PD is movable along a longitudinal direction of the conveyance path 102 by a predetermined drive mechanism. The conveyance arm AM is slidable with respect to the pedestal PD in the longitudinal direction of the conveyance path 102, and is also rotatable about a predetermined axis. Moreover, a fork F having a suction mechanism, for example, is provided at a front end of the conveyance arm AM. The conveyance robot 102R, for example, extends the conveyance arm AM into the substrate loading/unloading unit 101 to receive the substrate S on the substrate stage 101S while sucking and holding the substrate S with the fork F, and convey the substrate S, for example, to the substrate step measurement unit 103.

The substrate step measurement unit 103 may include, for example, a scanning electron microscope (SEM), an atomic force microscope (AFM), or a contact or non-contact stylus surface roughness meter. The substrate step measurement unit 103 measures a front surface of the substrate S conveyed by the conveyance robot 102R to generate step information. The step information is transmitted to the control unit 107 described later.

The first liquid application unit 104 includes a substrate holding stage 104S, an inkjet coating machine 104I, and a first light irradiation unit 104L. The substrate S conveyed from the conveyance robot 102R is placed on the substrate holding stage 104S. The inkjet coating machine 104I may discharge, for example, the organic resist CR from the inkjet nozzle IJ (FIGS. 2A to 2D) with respect to the recess portion RP (FIGS. 2A to 2D) on the front surface of the substrate S held by the substrate holding stage 104S based on an instruction signal from the control unit 107. The first light irradiation unit 104L has a light source (not shown) that emits light having a wavelength to which the organic resist CR is photosensitive. As a result, the first light irradiation unit 104L irradiates light to the substrate S on which the organic resist CR is discharged into the recess portion RP according to the instruction signal from the control unit 107. Further, the light source may have a large lamp capable of irradiating light to an entire surface of the substrate, or may have a small lamp capable of irradiating light to the recess portion RP. In the case of the small lamp, a support unit that movably supports the small lamp is preferably provided as well.

The second liquid application unit 105 may have, for example, a spin coater. That is, the second liquid application unit 105 has a holding unit 105H that rotatably holds the substrate S received by the conveyance robot 102R, a cup 105C that surrounds a circumference of the substrate S held by the holding unit 105H, and a dispenser nozzle 105N capable of dropping, for example, the inorganic resist SR onto the substrate S held by the holding unit 105H. With such a configuration, the second liquid application unit 105 forms a resist layer by spreading the inorganic resist SR dropped on the substrate with a centrifugal force by rotating the substrate S at high speed.

The imprint unit 106 may include a template holding unit that holds the template interchangeably (not shown), and a drive mechanism that drives the template holding unit so as to press the template against the resist layer formed on the substrate (not shown), and a second light irradiation unit 106L that irradiates the resist layer with light. The second light irradiation unit 106L emits light having a wavelength to which the resist is photosensitive against which the template is pressed. As a result, the template TP (FIGS. 3A to 3D) is pressed against the inorganic resist SR formed by the second liquid application unit 105, and light is irradiated to cure the inorganic resist SR while being pressed thereagainst.

The control unit 107 may be implemented as a computer including a CPU, a ROM, a RAM, and the like. Besides, the control unit 107 may be implemented by hardware such as an application-specific integrated circuit (ASIC), a programmable gate array (PGA), and a field programmable gate array (FPGA). The control unit 107 comprehensively controls the imprint apparatus 100 based on a control program and various data. Specifically, the control unit 107 may generate a signal indicating a location and a size of the recess portion RP based on the step information generated by the substrate step measurement unit 103. Then, an appropriate amount of the organic resist CR is supplied to the recess portion RP by controlling the first liquid application unit 104 based on the signal. In addition, the control unit 107 generates various instruction signals based on the control program and various data, and transmits the generated instruction signals to the substrate loading/unloading unit 101, the conveyance robot 102R, the substrate step measurement unit 103, the first liquid application unit 104, the second liquid application unit 105, the imprint unit 106, and the like. The program and various data may be downloaded by wire or wirelessly from, for example, a non-temporary computer-readable storage medium such as a hard disk drive (HDD), a semiconductor memory or a server.

Further, a display device such as a liquid crystal display or an organic EL display, for example, may be connected to the control unit 107, and an input device such as a keyboard or a computer mouse, for example, may be connected thereto.

According to the imprint apparatus 100 having the above-described configuration, each process in the imprint method according to the first embodiment may be carried out as an example. Therefore, the imprint apparatus 100 according to the present embodiment also exhibits the same effect as the imprint method according to the first embodiment. Moreover, since the substrate loading/unloading unit 101, the substrate step measurement unit 103, the first liquid application unit 104, the second liquid application unit 105, and the imprint unit 106 are connected by the conveyance path 102, and the substrate S is conveyed from each of the units 101, 103 to 106 by the conveyance robot 102R, each process of the imprint method according to the first embodiment can be continuously and efficiently carried out.

Third Embodiment

Figure 7:
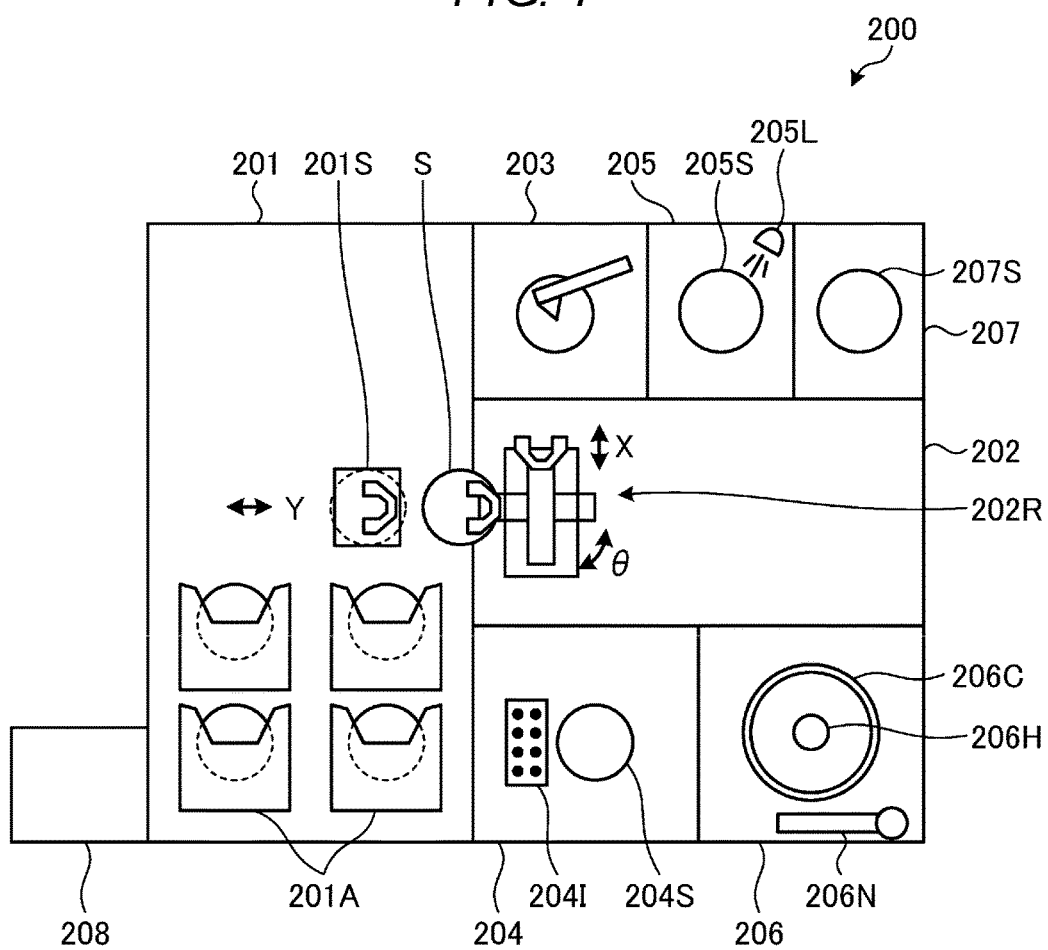
FIG. 7 is a top view schematically showing a film formation apparatus according to a third embodiment.

Next, a film formation apparatus according to a third embodiment will be described with reference to FIG. 7. As shown in FIG. 7, a film formation apparatus 200 according to the present embodiment includes a substrate loading/unloading unit 201, a conveyance chamber 202, a substrate step measurement unit 203, a first liquid application unit 204, a light irradiation unit 205, and a second liquid application unit 206, a substrate heating unit 207, and a control unit 208.

The substrate loading/unloading unit 201 may accommodate a plurality of substrate storage cassettes 201A (four in an illustrated example). The substrate storage cassette 201A may be, for example, a closed substrate storage cassette called a front opening unified pod (FOUP). Besides, the substrate loading/unloading unit 201 has a substrate stage 201S and a conveyance arm (not shown). The substrate S is conveyed and placed on the substrate stage 201S from the substrate storage cassette 201A by the conveyance arm. The substrate stage 201S is movable in a Y-axis direction in the drawing, and cooperates with a conveyance robot 202R, which is movably provided in the conveyance chamber 202, to allow delivery of the substrate S between the substrate loading/unloading unit 201 and the conveyance chamber 202.

The conveyance chamber 202 connects the substrate loading/unloading unit 201, the substrate step measurement unit 203, the first liquid application unit 204, the light irradiation unit 205, the second liquid application unit 206, and the substrate heating unit 207 to one another to allow conveyance of the substrate S among these units 201, 203 to 207. Moreover, the conveyance robot 202R provided in the conveyance chamber 202 may have the same configuration as the conveyance robot 102R of the imprint apparatus according to the second embodiment.

The substrate step measurement unit 203 may have the same configuration as the substrate step measurement unit 103 of the imprint apparatus according to the second embodiment, thereby measuring the front surface of the substrate S to generate step information. The step information is transmitted to the control unit 208 described later.

The first liquid application unit 204 includes a substrate holding stage 204S and an inkjet coating machine 204I. The substrate S conveyed from the conveyance robot 202R is placed on the substrate holding stage 204S. The inkjet coating machine 204I may discharge, for example, the organic resist CR from the inkjet nozzle IJ (FIGS. 2A to 2D) with respect to the recess portion RP (FIGS. 2A to 2D) on the front surface of the substrate S held by the substrate holding stage 204S based on the instruction signal from the control unit 107. As a result, droplets of the organic resist CR adhere to the recess portion RP.

The light irradiation unit 205 may have a substrate stage 205S and a light source 205L that emits light having a wavelength to which the organic resist CR is photosensitive. The light irradiation unit 205 irradiates light to the substrate S conveyed from the first liquid application unit 204 by the conveyance robot 202R and placed on the substrate stage 205S. Further, the light source may have a large lamp capable of irradiating light to an entire surface of the substrate, or may have a small lamp capable of irradiating light to the recess portion RP. In the case of the small lamp, a support unit that movably supports the small lamp is preferably provided as well.

The second liquid application unit 206 may have, for example, a spin coater. That is, the second liquid application unit 206 has a holding unit 206H that rotatably holds the substrate S received by the conveyance robot 202R, a cup 206C that surrounds the substrate S held by the holding unit 206H, and a dispenser nozzle 206N capable of dropping, for example, the inorganic resist SR on the substrate S held by the holding unit 206H. The second liquid application unit 206 forms a resist layer by spreading the inorganic resist SR dropped on the substrate with a centrifugal force by rotating the substrate S at high speed.

The substrate heating unit 207 has a substrate stage 207S. The substrate stage 207S may have a heater therein, and a temperature of the substrate stage 207S can be maintained at a predetermined temperature by a temperature controller (not shown).

The control unit 208 may be configured in the same manner as the control unit 107 in the imprint apparatus 100 according to the second embodiment. The control unit 208 generates various instruction signals (including a signal indicating a location and a size of the recess portion RP) based on a control program and various data, and transmits the generated instruction signals to the substrate loading/unloading unit 201, the conveyance robot 202R, the substrate step measurement unit 203, the first liquid application unit 204, the light irradiation unit 205, the second liquid application unit 206, the substrate heating unit 207, and the like. The program and various data may be downloaded by wire or wirelessly from, for example, a non-temporary computer-readable storage medium such as a hard disk drive (HDD), a semiconductor memory or a server.

Further, a display device or an input device may be connected to the control unit 208 in the same manner as the control unit 107 described above.

According to the film formation apparatus 200 having the above-described configuration, a process up to the application of the inorganic resist SR in the imprint method according to the first embodiment can be carried out as an example. Therefore, even with the film formation apparatus 200 according to the present embodiment, the recess portion RP of the under layer (FIGS. 2A to 2D) can be substantially embedded with the organic resist CR, and the inorganic resist SR can be formed thereon. Therefore, the same effect as the imprint method according to the first embodiment can be exhibited.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

For example, in the first embodiment, a discharge of the organic resist CR from the inkjet nozzle IJ into the recess portion RP may be performed twice or three times or more. In the case of performing twice, for example, during a second discharge period, the organic resist CR may be discharged into gaps between droplets adhering to the recess portion RP by the first discharge. In addition, prior to the second discharge, light may be irradiated to the droplets of the organic resist CR by the first discharge.

What is claimed is:

1. An imprint method for forming an etching mask for an etching process of an object, comprising:
    forming an etching mask film on an object;
    supplying a first photocurable resist on the etching mask film in a first region of the object, the first region being a recess;
    irradiating the first resist with first light;
    forming a second resist over the object;
    bringing a template into contact with the second resist;
    irradiating at least the second resist with second light through the template while the template is in contact with the second resist;
    removing a residual film of the second resist by etching with a first gas after irradiating with the second light; and
    etching the first resist and the etching mask film with a second gas until an upper surface and a lower surface of the object are exposed, using the second resist from which the residual film has been removed as a mask.

2. The imprint method according to claim 1, further comprising:
    determining location information of the recess on the object before supplying the first photocurable resist to the first region.

3. The imprint method according to claim 1, further comprising supplying the first resist to the first region using an inkjet.

4. The imprint method according to claim 1, wherein forming the second resist includes spin coating the second resist over the object.

5. The imprint method according to claim 1, wherein the first resist is photosensitive to a predetermined wavelength of the first light.

6. The imprint method according to claim 1, wherein a light intensity of the first light is lower than a light intensity of the second light.

7. The imprint method according to claim 1, wherein the first resist includes an organic substance and includes at least an acrylic group or a methacrylic group.

8. The imprint method according to claim 1, wherein the second resist includes at least one of silicon (Si), aluminum (Al), boron (B), phosphorus (P), sulfur (S), arsenic (As), or iron (Fe).

9. The imprint method according to claim 1, wherein an etching rate of the first resist is selected to be in a range of −10% to +10% of an etching rate of the etching mask film.

10. The imprint method according to claim 1, wherein the first resist, after the irradiation of the first light, has a viscosity in a range of 100 to 1000 (mPa·s).

11. The imprint method according to claim 1, wherein the second resist includes an inorganic element.

12. The imprint method according to claim 9, further comprising:
    transferring a pattern from the template to the second resist; and
    etching the first resist with the second resist as a mask.

* * * * *